United States Patent
Li et al.

(10) Patent No.: US 7,280,229 B2
(45) Date of Patent: Oct. 9, 2007

(54) EXAMINING A STRUCTURE FORMED ON A SEMICONDUCTOR WAFER USING MACHINE LEARNING SYSTEMS

(75) Inventors: Shifang Li, Pleasanton, CA (US); Junwei Bao, Fremont, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 289 days.

(21) Appl. No.: 11/003,961

(22) Filed: Dec. 3, 2004

(65) Prior Publication Data

US 2006/0119863 A1 Jun. 8, 2006

(51) Int. Cl.
*G01B 11/14* (2006.01)
*G01B 11/24* (2006.01)
*G01B 7/00* (2006.01)

(52) U.S. Cl. ........................ 356/625; 356/601; 702/155
(58) Field of Classification Search ................. 356/601
See application file for complete search history.

(56) References Cited

U.S. PATENT DOCUMENTS

| | | | |
|---|---|---|---|
| 5,889,593 A * | 3/1999 | Bareket ................. | 356/445 |
| 6,023,327 A * | 2/2000 | Shabde et al. ........... | 356/237.1 |
| 6,650,422 B2 * | 11/2003 | Singh et al. ............ | 356/601 |
| 6,704,661 B1 * | 3/2004 | Opsal et al. ............ | 702/27 |
| 6,785,638 B2 | 8/2004 | Niu et al. | |
| 2003/0028358 A1 * | 2/2003 | Niu et al. .............. | 703/2 |
| 2004/0017574 A1 * | 1/2004 | Vuong et al. ........... | 356/625 |
| 2004/0150838 A1 * | 8/2004 | Niu et al. .............. | 356/625 |
| 2004/0267397 A1 | 12/2004 | Doddl et al. | |
| 2005/0192914 A1 | 9/2005 | Drege et al. | |

OTHER PUBLICATIONS

U.S. Appl. No. 10/608,300, filed Dec. 30, 2004, Doddl et al.

* cited by examiner

*Primary Examiner*—Gregory J. Toatley, Jr.
*Assistant Examiner*—Jonathan Skovholt
(74) *Attorney, Agent, or Firm*—Morrison Foerster LLP

(57) ABSTRACT

A structure formed on a semiconductor wafer is examined by obtaining a first diffraction signal measured from the structure using an optical metrology device. A first profile is obtained from a first machine learning system using the first diffraction signal obtained as an input to the first machine learning system. The first machine learning system is configured to generate a profile as an output for a diffraction signal received as an input. A second profile is obtained from a second machine learning system using the first profile obtained from the first machine learning system as an input to the second machine learning system. The second machine learning system is configured to generate a diffraction signal as an output for a profile received as an input. The first and second profiles include one or more parameters that characterize one or more features of the structure.

24 Claims, 5 Drawing Sheets

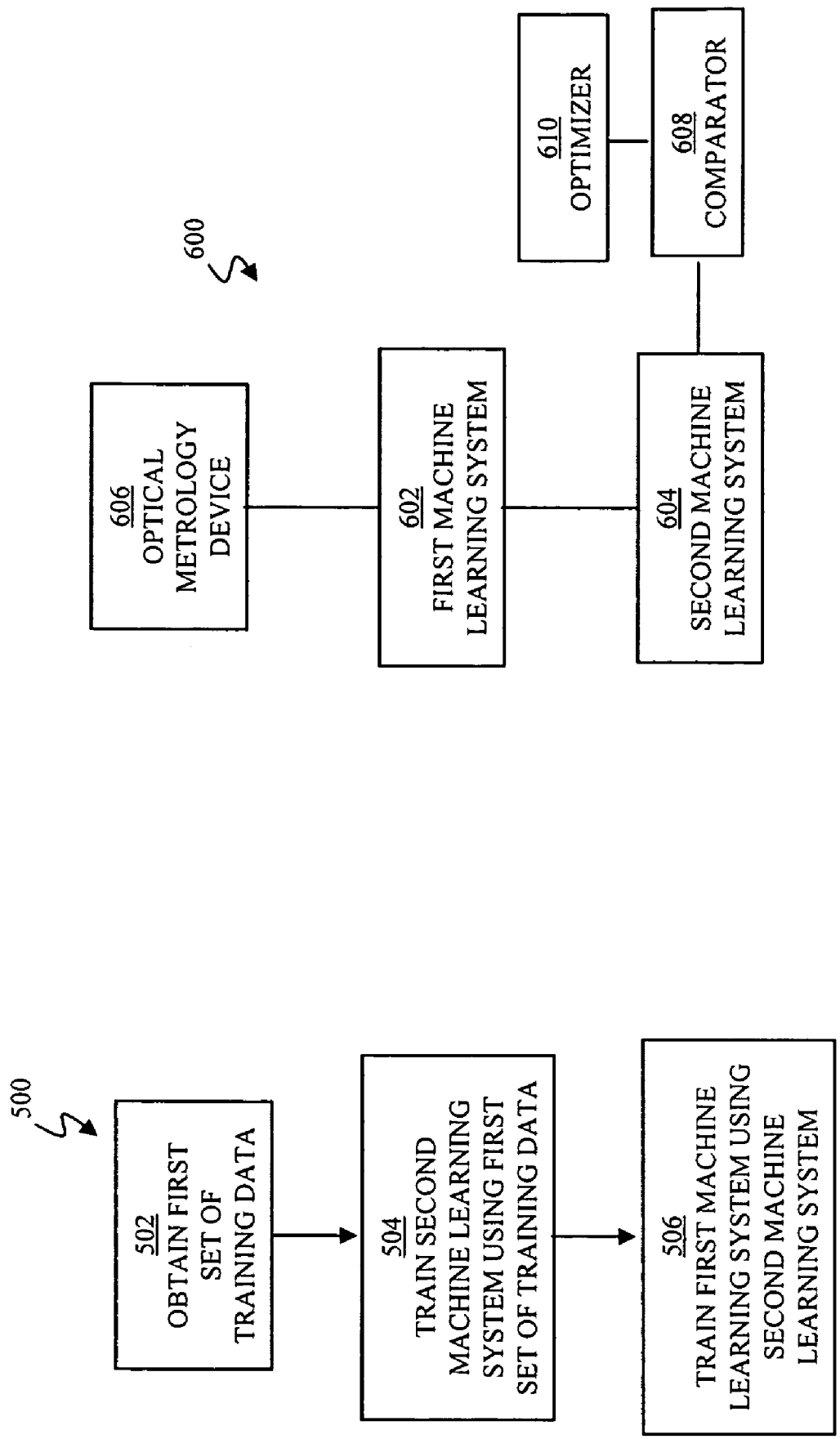

US 7,280,229 B2

EXAMINING A STRUCTURE FORMED ON A SEMICONDUCTOR WAFER USING MACHINE LEARNING SYSTEMS

BACKGROUND

1. Field

The present application relates to semiconductor wafer metrology, and, more particularly, to examining structures formed on semiconductor wafers using machine learning systems.

2. Related Art

In semiconductor manufacturing, metrology is typically used for quality assurance. For example, after fabricating a structure on a semiconductor wafer, a metrology system is used to examine the structure to evaluate the fabrication process utilized to form the structure. The structure can be a feature of an integrated circuit formed on the wafer, or a test structure, such as a periodic grating, formed adjacent to the integrated circuit.

Optical metrology is a type of metrology that involves directing an incident optical signal at the structure, measuring the resulting diffraction signal, and analyzing the diffraction signal to determine a feature of the structure. Machine learning systems have been used to analyze diffraction signals obtained using an optical metrology device. However, these machine learning systems, which generate profiles as outputs based on diffraction signals received as inputs, can produce erroneous results when noise is present in the diffraction signals obtained from the optical metrology device, and when the machine learning system have been trained using a model that is not accurate enough to describe the actual profile of the structure.

SUMMARY

In one exemplary embodiment, a structure formed on a semiconductor wafer is examined by obtaining a first diffraction signal measured from the structure using an optical metrology device. A first profile is obtained from a first machine learning system using the first diffraction signal obtained as an input to the first machine learning system. The first machine learning system is configured to generate a profile as an output for a diffraction signal received as an input. A second profile is obtained from a second machine learning system using the first profile obtained from the first machine learning system as an input to the second machine learning system. The second machine learning system is configured to generate a diffraction signal as an output for a profile received as an input. The first and second profiles include one or more parameters that characterize one or more features of the structure.

BRIEF DESCRIPTION OF THE FIGURES

FIG. 5 is a flow chart of an exemplary process to train machine learning systems;

FIG. 6 is a block diagram of an exemplary system to examine a structure using machine learning systems.

DETAILED DESCRIPTION

The following description sets forth numerous specific configurations, parameters, and the like. It should be recognized, however, that such description is not intended as a limitation on the scope of the present invention or applications thereof, but instead provides examples and illustrations.

Figure 1:
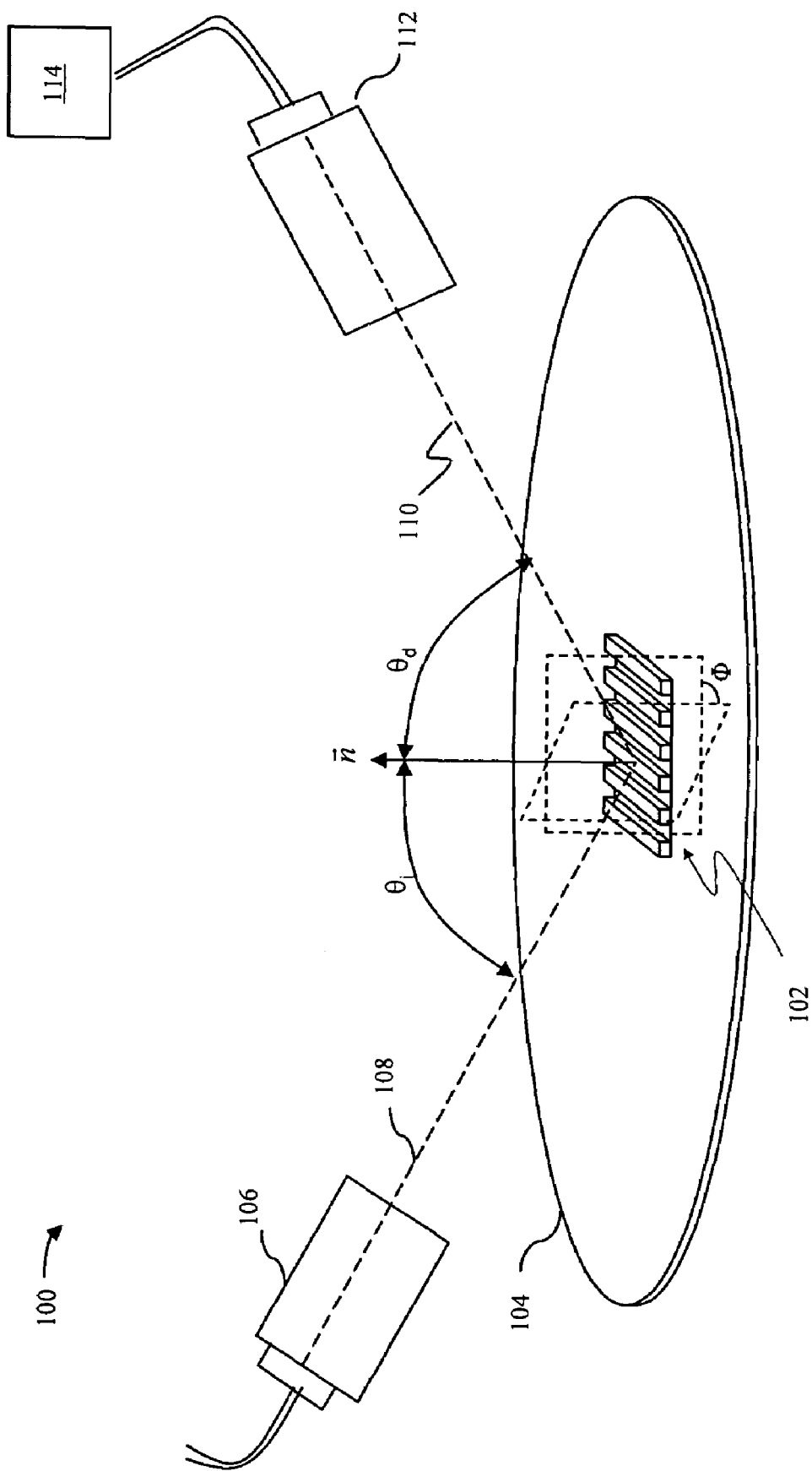
FIG. 1 is a block diagram of an exemplary metrology system.

With reference to FIG. 1, a metrology system 100 can be used to examine a structure formed on a semiconductor wafer 104. For example, metrology system 100 can be used to determine a feature of a periodic grating 102 formed on wafer 104. Periodic grating 102 can be formed in test areas on wafer 104, such as adjacent to a device formed on wafer 104. In examples, periodic grating 102 can be formed in an area of the device that does not interfere with the operation of the device or along scribe lines on wafer 104. It should be recognized that the structure being examined can be any type of structure formed on wafer 104, including a feature of an integrated circuit device.

As depicted in FIG. 1, metrology system 100 can include a metrology device, and in particular, an optical metrology device with a source 106 and a detector 112. Periodic grating 102 is illuminated by an incident beam 108 from source 106. In the present example, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. It should be recognized that angles $\theta_i$ and $\theta_d$ can be zero with respect to normal $\vec{n}$. Detector 112 converts the diffracted beam 110 into a measured diffraction signal, which can include reflectance, tan ($\Psi$), cos ($\Delta$), Fourier coefficients, and the like. The measured diffraction signal can be analyzed in processing module 114.

With reference to FIGS. 2A-2E, in one exemplary embodiment, one or more features of the structure being examined are characterized using a profile defined by one or more parameters. For example, in FIG. 2A, the height and width of a cross section of a structure can be characterized using a profile 200 defined by parameters h1 and w1 corresponding to the height and width, respectively, of the cross section of the structure.

Figure 2E:
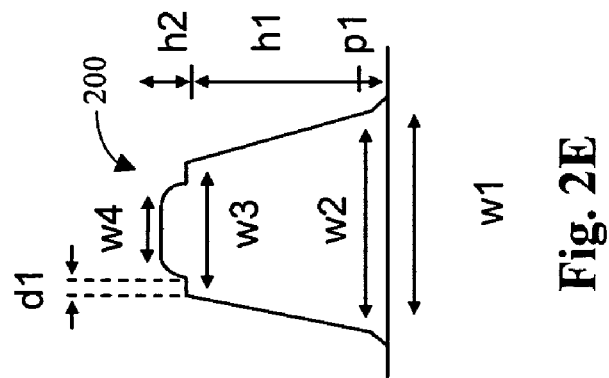
FIG. 2A-E are exemplary profiles that characterize a structure formed on a semiconductor wafer.
Figure 2C:
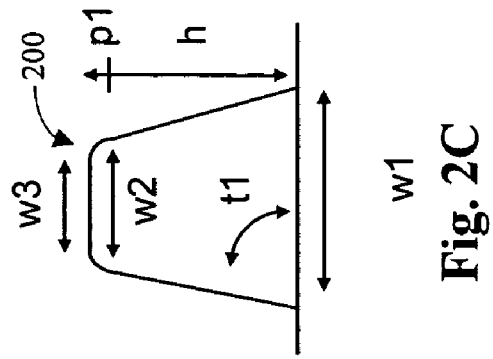
Figure 2D:
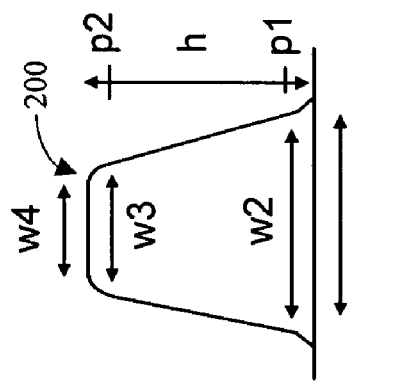
Figure 2A:
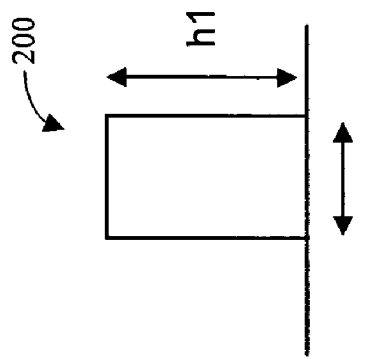
Figure 2B:
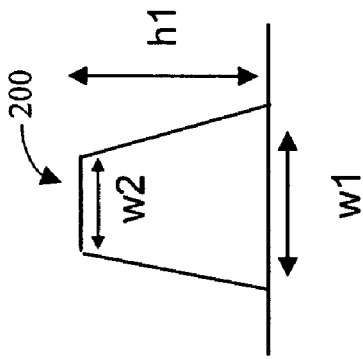

As depicted in FIGS. 2B to 2E, additional features of the structure can be characterized (parameterized) by increasing the number of parameters used to define profile 200. For example, as depicted in FIG. 2B, the height, bottom width, and top width of the structure can be characterized by parameters h1, w1, and w2, respectively. Note that a width can be referred to as a critical dimension (CD). For example, in FIG. 2B, parameter w1 and w2 can be described as defining a bottom CD and a top CD, respectively. It should be recognized that various types of parameters may be used to define a profile, including angle of incident (AOI), pitch, n & k, hardware parameters (e.g., polarizer angle), and the like.

Figure 3:
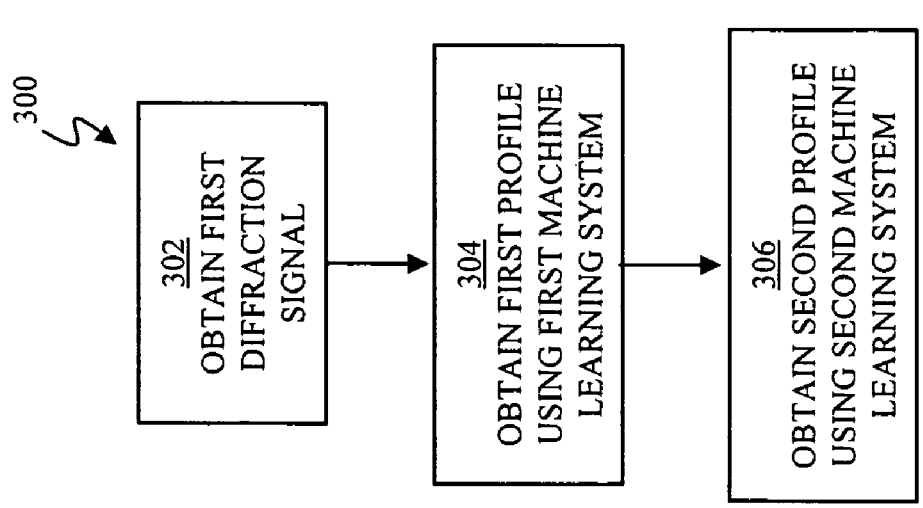
FIG. 3 is a flow chart of an exemplary process to examine a structure using machine learning systems.

With reference to FIG. 3, an exemplary process 300 to examine a structure formed on a wafer is depicted. In step 302, a first diffraction signal measured from the structure using an optical metrology device is obtained. For example, with reference to FIG. 1, a measured diffraction signal can be obtained using source 106 and detector 112 of metrology system 100. It should be recognized, however, that any optical metrology device can be used, such as an ellipsometer, reflectometer, and the like. With reference again to FIG. 3, it should also be recognized that in step 302 the diffraction signal can be directly obtained from the optical metrology device after the diffraction signal is measured using the optical metrology device. Alternatively, the diffraction signal can be measured using optical metrology device, stored, then obtained in step 302.

In step 304, a first profile is obtained from a first machine learning system using the first diffraction signal as an input to the first machine learning system. In the present exemplary embodiment, the first machine learning system is configured to generate a profile as an output when a diffraction signal is received as an input. The first profile obtained from the first machine learning system includes one or more parameters that characterize one or more features of the structure being examined. The first profile obtained using the first machine learning system is a close approximation of the actual profile of the structure (i.e., the first profile is in a global minimum range). However, noise, which is typically present in the first diffraction signal obtained from the optical metrology device, may mean that there is a closer matching profile than the first profile obtained using the first machine learning system (i.e., the first profile is not yet optimized in the global minimum range).

Thus, in step 306, a second profile is obtained from a second machine learning system using the first profile obtained from the first machine learning system as an input to the second machine learning system. In the present exemplary embodiment, the second machine learning system is configured to generate a diffraction signal as an output when a profile is received as an input. The second profile obtained using the second machine learning system is a global minimum, and the closest approximation of the actual profile of the structure. Because the global minimum range was located using the first machine learning system and the second profile is a minimum in the global minimum range, the second profile is the best match for the actual profile of the structure even with noise present.

Figure 4:
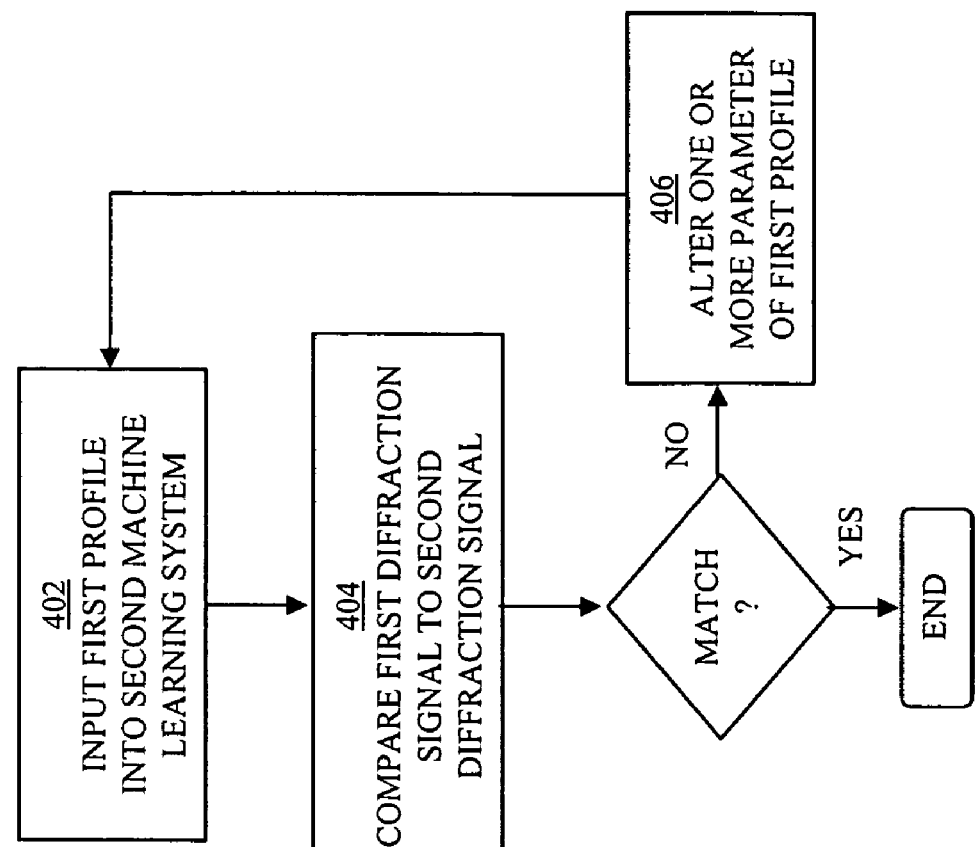
FIG. 4 is a flow chart of an exemplary iterative process that can be used in the exemplary process depicted in FIG. 3.

In the present exemplary embodiment, an iterative process is used to obtain the second profile in step 306. In particular, with reference to FIG. 4, in step 402, the first profile generated as an output of the first machine learning system is used as an input to the second machine learning system. The second machine learning system outputs a second diffraction signal. In step 404, the first diffraction signal obtained from the optical metrology device is compared to the second diffraction signal. In step 406, when the first and second diffraction signals do not match within one or more matching criteria, one or more parameters of the first profile are altered. Examples of matching criteria include goodness of fit, cost, and the like. Steps 402, 404, and 406 are then iterated until the first and second diffraction signals match within the one or more matching criteria.

In iterating steps 402, 404, and 406, an optimization algorithm can be used to more quickly obtain a second diffraction signal that matches the first diffraction signal within the one or more matching criteria. The optimization algorithm can include Gauss-Newton, gradient descent, simulated annealing, Levenberg-Marquardt, and the like. In the present exemplary embodiment, because the global minimum range was located using the first machine learning system, a local optimization algorithm, such as Levenberg-Marquardt, can be used rather than a global optimization algorithm, such as simulated annealing, which is typically much slower than a local optimization algorithm. For more information on such algorithms and optimizations, see U.S. application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

In the present exemplary embodiment, before the first and second machine learning systems are used to examine a structure, the first and second machine learning systems are trained using a training process. With reference to FIG. 5, an exemplary training process 500 is depicted. It should be recognized, however, that the first and second machine learning systems can be trained using various training processes. For more information on machine learning systems and training processes for machine learning systems, see U.S. application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In step 502, a first set of training data is obtained. The first set of training data includes profile and diffraction signal pairs. Each profile and diffraction signal pair includes a profile and a corresponding diffraction signal. Although there is a one-to-one correspondence between a profile and a diffraction signal in each profile and diffraction signal pair, there need not be a known relationship, either analytic or numeric, between the profile and the diffraction signal.

In one exemplary embodiment, the first set of training data is created by generating a set of profiles by varying one or more parameters, either alone or in combination, that define the profile. An overall range of profiles to be generated can be determined based on an expected range of variability in the actual profile of the structure to be examined. For example, if the actual profile of the structure to be examined is expected to have a bottom width that can vary between $x_1$ and $x_2$, then the overall range of profiles can be generated by varying the parameter corresponding to the bottom width between $x_1$ and $x_2$. Alternatively, the overall range of profiles can be generated based on a random or a systematic sampling of the expected range of variability in the actual profile of the structure.

After generating a set of profiles, diffraction signals are generated for each profile in the set of profiles using a modeling technique, such as rigorous coupled wave analysis (RCWA), integral method, Fresnel method, finite analysis, modal analysis, and the like. Alternatively, the diffraction signals can be generated using an empirical technique, such as measuring a diffraction signal using an optical metrology device, such as an ellipsometer, reflectometer, and the like, or measuring the profile using an atomic force microscope (AFM), scanning electron microscope (SEM), and the like.

In step 504, the second machine learning system is trained using the first set of training data. In particular, using profile and diffraction signal pairs from the first set of training data, the second machine learning system is trained to generate a diffraction signal as an output for a profile received as an input.

In the present exemplary embodiment, in step 506, after the second machine learning system has been trained, the first machine learning system is trained using the second machine learning system. In particular, a second set of training data is generated using the second machine learning system after the second machine learning system has been trained using the first set of training data. The second set of training data includes diffraction signal and profile pairs. A set of profiles is generated by varying one or more parameters, either alone or in combination, that define the profiles. Diffraction signals are generated for the set of profiles using the second machine learning system. The second set of training data can include all or part of the first set of training data.

The second set of training data generated using the second machine learning system is then used to train the first machine learning system. In particular, using diffraction signal and profile pairs from the second set of training data, the first machine learning system is trained to generate a profile as an output for a diffraction signal received as an input.

With reference to FIG. 6, an exemplary system 600 for examining a structure formed on a semiconductor wafer is depicted. System 600 includes a first machine learning system 602 and a second machine learning system 604. As described above, first machine learning system 602 receives a first diffraction signal measured using metrology device 606. The first diffraction signal is used as an input to first machine learning system 602, which outputs a first profile. A second profile is obtained from second machine learning system 604 using the first profile as an input to second machine learning system 604.

In the present exemplary embodiment, system 600 includes a comparator 608 and an optimizer 610. Comparator 608 and optimizer 610 iteratively obtain the second profile from second machine learning system 604. In particular, comparator 608 compares the second diffraction signal generated as an output from second machine learning system 604 to the first diffraction signal obtained from optical metrology device 606. When the diffraction signals do not match within one or more matching criteria, one or more parameters of the first profile used as an input to second machine learning system 604 are altered to generate another second diffraction signal. Optimizer 610 applies an optimization algorithm to more quickly obtain a second diffraction signal that matches the first diffraction signal within the one or more matching criteria. The second profile is the same as the first profile that was used as the input to second machine learning system 604 to generate the second diffraction signal that matched the first diffraction signal within the one or more matching criteria.

In one exemplary embodiment, first machine learning system 602 and second machine learning system 604 can be implemented as components of processor 114 (FIG. 1) of metrology system 100 (FIG. 1). Optical metrology device 606 can include source 106 (FIG. 1) and detector 116 (FIG. 1). It should be recognized, however, that first machine learning system 602 and second machine learning system 604 can be implemented as one or more modules separate from processor 114 (FIG. 1) and metrology system 100 (FIG. 1).

Additionally, first machine learning system 602, second machine learning system 604, and optical metrology device 606 can be located in one physical location or in separate physical locations. For example, optical metrology device 606 can be located in one physical location to measure a first diffraction signal. The first diffraction signal can then be transmitted to first machine learning system 602 and second machine learning system 604 located in another physical location separate from the physical location of optical metrology device 606.

It should be recognized that first machine learning system 602 and second machine learning system 604 can be implemented using software, hardware, or combination of software and hardware. Hardware can include general purpose processors, application specific integrated circuits (ASICs), field programmable gate arrays (FPGAs), and the like.

Figure 7:
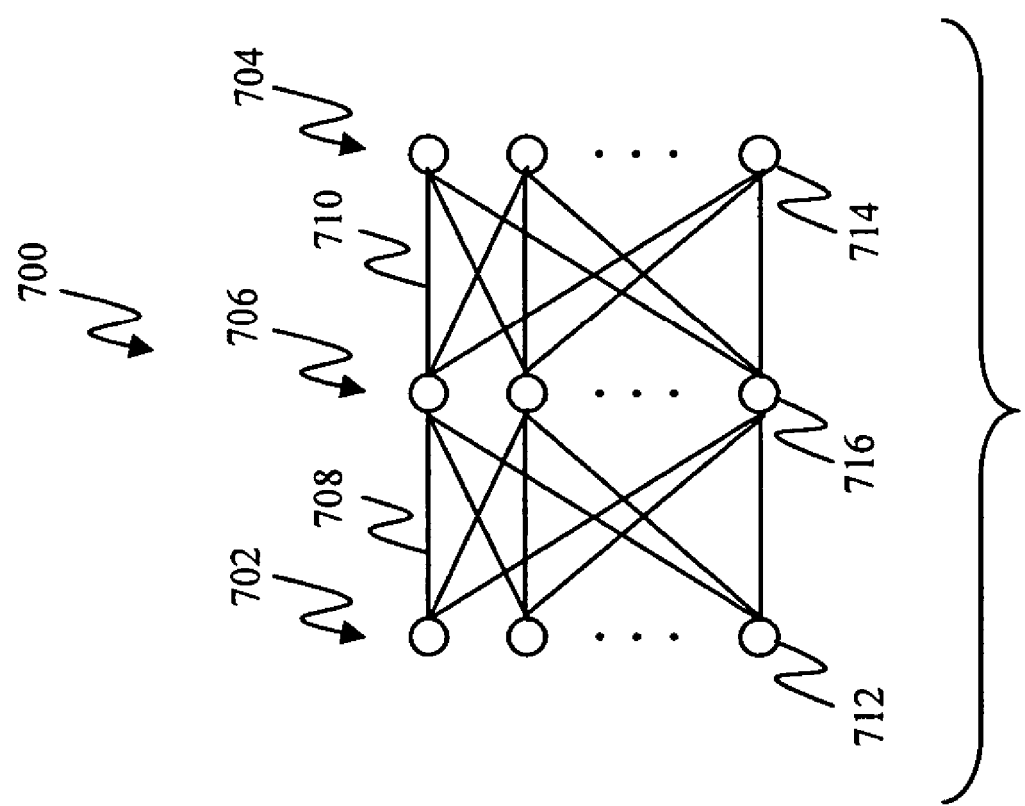
FIG. 7 is a block diagram of an exemplary neural network.

In one exemplary embodiment, first machine learning system 602 and second machine learning system 604 are neural networks. With reference to FIG. 7, an exemplary neural network 700 is depicted. Neural network 700 uses a back-propagation algorithm. Neural network 700 includes an input layer 702, an output layer 704, and a hidden layer or layers 706 between input layer 702 and output layer 704. Input layer 702 and hidden layer 706 are connected using links 708. Hidden layer 706 and output layer 704 are connected using links 710. It should be recognized, however, that neural network 700 can include any number of layers connected in various configurations. For a more detailed description of machine learning systems and algorithms, see "Neural Networks" by Simon Haykin, Prentice Hall, 1999, which is incorporated herein by reference in its entirety.

As depicted in FIG. 7, input layer 702 includes one or more input nodes 712. In an exemplary implementation, an input node 712 in input layer 702 corresponds to a parameter of a profile that is inputted into neural network 700. Thus, the number of input nodes 712 corresponds to the number of parameters used to characterize the profile. For example, if a profile is characterized using two parameters (e.g., top and bottom widths), input layer 702 includes two input nodes 712, where a first input node 712 corresponds to a first parameter (e.g., a top width) and a second input node 712 corresponds to a second parameter (e.g., a bottom width).

The foregoing descriptions of exemplary embodiments have been presented for purposes of illustration and description. They are not intended to be exhaustive or to limit the invention to the precise forms disclosed, and it should be understood that many modifications and variations are possible in light of the above teaching.

We claim:

1. A method of examining a structure formed on a semiconductor wafer, the method comprising:
   a) obtaining a first diffraction signal measured from the structure using an optical metrology device;
   b) obtaining a first profile from a first machine learning system using the first diffraction signal obtained in a) as an input to the first machine learning system, wherein the first machine learning system is configured to generate a profile as an output for a diffraction signal received as an input; and
   c) obtaining a second profile from a second machine learning system using the first profile obtained from the first machine learning system as an input to the second machine learning system, wherein the second machine learning system is configured to generate a diffraction signal as an output for a profile received as an input, and wherein the first and second profiles include one or more parameters that characterize one or more features of the structure.

2. The method of claim 1, wherein c) comprises:
   d) inputting the first profile as an input to the second machine learning system, wherein the second machine learning system outputs a second diffraction signal;
   e) comparing the first diffraction signal to the second diffraction signal;
   f) when the first and second diffraction signals do not match within one or more matching criteria, altering one or more parameters of the first profile; and g) iterating d), e), and f) until the first and second diffraction signals match within the one or more matching criteria, wherein the one or more parameters of the first profile altered in f) are used in iterating d).

3. The method of claim 2, wherein, when the first and second diffraction signals match within the one or more matching criteria, the second profile is the same as the first profile used as the input to the second machine learning system to output the second diffraction signal that matched the first diffraction signal within the one or more matching criteria.

4. The method of claim 2, wherein an optimization algorithm is applied in iterating d), e), and f).

5. The method of claim 4, wherein the optimization algorithm is a Gauss-Newton, gradient descent, simulated annealing, or Levenberg-Marquardt algorithm.

6. The method of claim 1, wherein the second machine learning system was trained using a training process, the training process comprising:
   obtaining a first set of training data, the first set of training data having profile and diffraction signal pairs; and
   using the profile and diffraction signal pairs from the first set of training data to train the second machine learning system to generate a diffraction signal as an output for a profile received as an input.

7. The method of claim 6, wherein the first machine learning system was trained using the training process, the training process further comprising:
   generating a second set of training data using the second machine learning system after the second machine learning system has been trained using the first set of training data, the second set of training data having diffraction signal and profile pairs; and
   using the diffraction signal and profile pairs from the second set of training data to train the first machine learning system to generate a profile as an output for a diffraction signal received as an input.

8. The method of claim 6, wherein the diffraction signals in the first set of training data were generated using a modeling technique prior to training the first and second machine learning systems.

9. The method of claim 8, wherein the modeling technique includes rigorous coupled wave analysis, integral method, Fresnel method, finite analysis, or modal analysis.

10. The method of claim 1, wherein the first and second machine learning systems are neural networks.

11. A method of training machine learning systems to be used in examining a structure formed on a semiconductor wafer, wherein a first machine learning system is trained to output a profile for a diffraction signal received as an input, wherein a second machine learning system is trained to output a diffraction signal for a profile received as an input, and wherein the profiles include one or more parameters that characterize one or more features of the structure to be examined, the method comprising:
   a) obtaining a first set of training data, the first set of training data having profile and diffraction signal pairs;
   b) training the second machine learning system using the first set of training data;
   c) after the second machine learning system is trained, generating a second set of training data using the second machine learning system, the second set of training data having diffraction signal and profile pairs; and
   d) training the first machine learning system using the second set of training data.

12. The method of claim 11, wherein the diffraction signals in the first set of training data were generated using a modeling technique prior to training the first and second machine learning systems.

13. The method of claim 12, wherein the modeling technique is rigorous coupled wave analysis, integral method, Fresnel method, finite analysis, or modal analysis.

14. A computer-readable storage medium containing computer executable instructions for causing a computer to examine a structure formed on a semiconductor wafer, comprising instructions for:
   a) obtaining a first diffraction signal measured from the structure using an optical metrology device;
   b) obtaining a first profile from a first machine learning system using the first diffraction signal obtained in a) as an input to the first machine learning system, wherein the first machine learning system is configured to generate a profile as an output for a diffraction signal received as an input; and
   c) obtaining a second profile from a second machine learning system using the first profile obtained from the first machine learning system as an input to the second machine learning system, wherein the second machine learning system is configured to generate a diffraction signal as an output for a profile received as an input, and wherein the first and second profiles include one or more parameters that characterize one or more features of the structure.

15. The computer-readable storage medium of claim 14, wherein c) comprises:
   d) inputting the first profile as an input to the second machine learning system, wherein the second machine learning system outputs a second diffraction signal;
   e) comparing the first diffraction signal to the second diffraction signal;
   f) when the first and second diffraction signals do not match within one or more matching criteria, altering one or more parameters of the first profile; and
   g) iterating d), e), and f) until the first and second diffraction signals match within the one or more matching criteria, wherein the one or more parameters of the first profile altered in f) is used in iterating d).

16. The computer-readable storage medium of claim 15, wherein, when the first and second diffraction signals match within the one or more matching criteria, the second profile is the same as the first profile used as the input to the second machine learning system to output the second diffraction signal that matched the first diffraction signal within the one or more matching criteria.

17. The computer-readable storage medium of claim 15, wherein an optimization algorithm is applied in iterating d), e), and f).

18. A system to examine a structure formed on a semiconductor wafer, the system comprising:
   a first machine learning system configured to receive a first diffraction signal and generate a profile as an output, wherein the profile includes one or more parameters that characterize one or more features of the structure; and
   a second machine learning system configured to receive the profile generated as the output from the first machine learning system and generate a second diffraction signal.

19. The system of claim 18, further comprising:
   a comparator configured to compare the first and second diffraction signals.

20. The system of claim 19, wherein, when the first and second diffraction signals do not match within one or more matching criteria, additional second diffraction signals are generated using the second machine learning system by altering one or more parameters of the profile until the first and second diffraction signals match within the one or more matching criteria.

21. The system of claim 20, further comprising:
an optimizer configured to apply an optimization algorithm to obtain a second diffraction signal that matches the first diffraction signal within the one or more matching criteria.

22. The system of claim 18, further comprising:
an optical metrology device configured to measure a diffraction signal from the structure, wherein the first diffraction signal received by the first machine learning system is measured using the optical metrology device.

23. The system of claim 22, wherein the optical metrology device is an ellipsometer or a reflectometer.

24. The system of claim 18, wherein the first and second machine learning systems are neural networks.

* * * * *